United States Patent
Kawano (10) Patent No.: US 8,823,853 B2
(45) Date of Patent: Sep. 2, 2014

(54) SOLID-STATE IMAGE SENSOR, METHOD OF MANUFACTURING THE SAME AND CAMERA

(75) Inventor: Akihiro Kawano, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 151 days.

(21) Appl. No.: 13/310,165

(22) Filed: Dec. 2, 2011

(65) Prior Publication Data

US 2012/0154658 A1    Jun. 21, 2012

(30) Foreign Application Priority Data

Dec. 15, 2010  (JP) ................................ 2010-279860
Nov. 18, 2011  (JP) ................................ 2011-253139

(51) Int. Cl.
  *H04N 3/14*   (2006.01)
  *H04N 5/335*  (2011.01)
  *H01L 23/58*  (2006.01)

(52) U.S. Cl.
  USPC ........... 348/311; 348/308; 348/309; 348/294; 257/652

(58) Field of Classification Search
  CPC ....... H01L 21/84; H01L 21/86; H01L 21/321; H01L 21/3105; H01L 21/02107; H01L 21/76831
  USPC .......................... 348/294–324; 438/196–208; 257/629–652, 304–305, 333, 760
  See application file for complete search history.

(56) References Cited

U.S. PATENT DOCUMENTS 6,482,718 B2   11/2002  Shiozawa et al. ............. 438/446
6,818,536 B2 *  11/2004  Ipposhi et al. ................ 438/585
7,187,023 B2   3/2007   Yoshihara
7,217,961 B2   5/2007   Tatani et al.
7,262,396 B2   8/2007   Inoue et al. ................. 250/208.1
7,300,810 B2   11/2007  Yoshihara (Continued)

FOREIGN PATENT DOCUMENTS

CN   1819252 A    8/2006
EP   1 028 470 A2  8/2000

(Continued)

OTHER PUBLICATIONS

Extended European Search Report dated Jul. 18, 2013, in European Patent Application No. 11191868.6, European Patent Office.

(Continued)

*Primary Examiner* — Timothy J Henn
*Assistant Examiner* — Pritham Prabhakher
(74) *Attorney, Agent, or Firm* — Fitzpatrick, Cella, Harper & Scinto (57) ABSTRACT

An image sensor includes a charge accumulation region of a first conductivity type, an isolating semiconductor region formed from an impurity semiconductor region of a second conductivity type, a channel stop region formed from an impurity semiconductor region of the second conductivity type which is located on the isolating semiconductor region, and an insulator arranged on the channel stop region. The insulator includes a first insulating portion arranged above the isolating semiconductor region via the channel stop region, a second insulating portion arranged adjacent to an outside of the first insulating portion, wherein thickness of the second insulating potion decreases with an increase in distance from the first insulating portion, and a third insulating portion formed on the first insulating portion, wherein the third insulating portion has upper and side faces connecting the upper face to an upper face of the second insulating portion.

12 Claims, 4 Drawing Sheets

(56) References Cited

U.S. PATENT DOCUMENTS

| | | | |
|---|---|---|---|
| 7,351,598 B2 | 4/2008 | Tatani et al. | |
| 7,378,695 B2 | 5/2008 | Yoshihara | 257/292 |
| 7,851,838 B2 | 12/2010 | Yoshihara | |
| 7,898,000 B2 | 3/2011 | Tatani et al. | |
| 7,943,962 B2 | 5/2011 | Tatani et al. | |
| 8,012,849 B2* | 9/2011 | Asano et al. | 438/433 |
| 8,138,581 B2* | 3/2012 | Hirler | 257/652 |
| 8,283,747 B2* | 10/2012 | Tanaka et al. | 257/500 |
| 8,451,362 B2* | 5/2013 | Lee et al. | 348/309 |
| 8,470,620 B2 | 6/2013 | Yoshihara | |
| 8,563,406 B2* | 10/2013 | Takafuji et al. | 438/473 |
| 2003/0127667 A1 | 7/2003 | Inoue et al. | |
| 2005/0093020 A1* | 5/2005 | Inoue et al. | 257/192 |
| 2005/0156220 A1* | 7/2005 | Segawa et al. | 257/304 |
| 2005/0263804 A1 | 12/2005 | Yoshihara | |
| 2010/0102375 A1* | 4/2010 | Aoi | 257/316 |
| 2010/0194943 A1* | 8/2010 | Mabuchi | 348/294 |
| 2011/0027932 A1 | 2/2011 | Tatani et al. | |
| 2011/0033968 A1 | 2/2011 | Tatani et al. | |
| 2011/0249163 A1* | 10/2011 | Ikeda et al. | 348/308 |
| 2013/0264673 A1 | 10/2013 | Yoshihara | |

FOREIGN PATENT DOCUMENTS

| | | |
|---|---|---|
| EP | 1 376 701 A2 | 1/2004 |
| JP | 11-186377 A | 7/1999 |
| JP | 2002-313905 A | 10/2002 |
| JP | 2003-142674 A | 5/2003 |
| JP | 2004281579 A | 10/2004 |
| JP | 2005-347325 A | 12/2005 |
| JP | 2006-024786 A | 1/2006 |
| KR | 1020060046277 A | 5/2006 |

OTHER PUBLICATIONS

Chinese Office Action dated Dec. 27, 2013, issued in counterpart Chinese Patent Application No. 201110418773.8, with an English translation.

* cited by examiner

SOLID-STATE IMAGE SENSOR, METHOD OF MANUFACTURING THE SAME AND CAMERA

BACKGROUND OF THE INVENTION

1. Field of the Invention

The present invention relates to a solid-state image sensor, a method of manufacturing the same, and a camera.

2. Description of the Related Art

A CCD (Charge Coupled Device) sensor and CMOS (Complementary Metal Oxide Semiconductor) sensor are known as solid-state image sensors. Recently, the pixel sizes of solid-state image sensors have decreased with an increase in the number of pixels and a decrease in chip size. With a decrease in pixel size, the element isolation method used has changed from the LOCOS (Local Oxidation of Silicon) method to the STI (Shallow Trench Isolation) method.

The STI method has a problem with image signal noise generated by defects present at the interface between a silicon substrate and a silicon oxide film near a trench and near the interface. For this reason, as an element isolation method to replace the STI method, the EDI (Expanding photodiode Design for Isolation) method has been proposed. This is a method of forming an element isolating portion of a pixel region by using a diffusion region formed in a semiconductor substrate and an oxide film protruding above the diffusion region (see Japanese Patent Laid-Open No. 2005-347325). It is possible to use the conventional STI method for a peripheral circuit portion.

In the structure disclosed in Japanese Patent Laid-Open No. 2005-347325, in order to extend an n-type charge accumulation region 14 below an element isolating region 12 of an element isolating portion in a pixel formation region, it is necessary to implant ions into a portion under the element isolating region 12. As an ion implantation method, a method of implanting ions in a tilted direction may be used. However, when the charge accumulation region 14 of a fine pixel is formed by this method, insufficient electrolysis relaxation occurs between a p-type region 11A in contact with the lower face of the element isolating region 12 and the n-type charge accumulation region 14 in contact with the p-type region. This may lead to an increase in dark current or the number of defective pixels due to electric field concentration.

It may be possible to form the n-type charge accumulation region 14 at a deep position in the silicon substrate by implanting n-type impurity ions at a high energy that allows them to penetrate through element isolating portions 11 and 12. This method, however, implants n-type impurity ions too deep in a region other than a portion below the element isolating portions 11 and 12 of a region where the charge accumulation region 14 should be formed. Forming the charge accumulation region 14 to a deep position makes it difficult to isolate a photoelectric conversion element between the adjacent pixels.

In addition, the method disclosed in Japanese Patent Laid-Open No. 2005-347325 damages a silicon substrate because of direct etching of the silicon substrate in an etching process of forming an element isolating layer. Etching damage on a silicon substrate can be a noise source for an image signal, and hence should be reduced as much as possible.

The present invention provides a technique advantageous in increasing a saturated charge amount, relaxing electric field concentration near an element isolating portion and reducing etching damage on a substrate.

One aspect of the present invention is associated with a solid-state image sensor. The solid-state image sensor includes a charge accumulation region of a first conductivity type formed in a semiconductor, an isolating semiconductor region formed from an impurity semiconductor region of a second conductivity type formed in the semiconductor, a channel stop region formed from an impurity semiconductor region of the second conductivity type which is located in the semiconductor and formed on the isolating semiconductor region, and an insulator arranged on the channel stop region. The insulator includes a first insulating portion arranged on the channel stop region on the isolating semiconductor region, and a second insulating portion having a structure arranged adjacent to the outside of the first insulating portion and decreases in thickness with an increase in distance from the first insulating portion. The charge accumulation region includes a peripheral portion which is formed by implanting ions into the semiconductor through the second insulating portion and is in contact with the channel stop region.

SUMMARY OF THE INVENTION

The present invention provides a technique advantageous in increasing a saturated charge amount, relaxing electric field concentration near an element isolating portion, and reducing etching damage on a substrate.

The first aspect of the present invention provides a solid-state image sensor comprising: a charge accumulation region of a first conductivity type formed in a semiconductor region; an isolating semiconductor region formed in the semiconductor region and formed from an impurity semiconductor region of a second conductivity type; a channel stop region formed from an impurity semiconductor region of the second conductivity type which is located in the semiconductor region and formed on the isolating semiconductor region; and an insulator arranged on the channel stop region, wherein the insulator includes a first insulating portion arranged above the isolating semiconductor region via the channel stop region, a second insulating portion arranged adjacent to an outside of the first insulating portion, wherein thickness of the second insulating portion decreases with an increase in distance from the first insulating portion, and a third insulating portion formed on the first insulating portion, wherein the third insulating portion has an upper face and a side face, the side face connecting the upper face of the third insulating portion to an upper face of the second insulating portion.

The second aspect of the present invention provides a method of manufacturing a solid-state image sensor, the method comprising the steps of: forming a polysilicon film on a semiconductor region; forming a mask having an opening on the polysilicon film; forming a first insulating portion and a second insulating portion arranged adjacent to an outside of the first insulating portion, by selectively oxidizing a portion of the polysilicon film by using the mask, wherein thickness of the second insulating portion decreases with an increase in distance from the first insulating portion; forming a channel stop region formed from an impurity semiconductor region of a second conductivity type by implanting ions into the semiconductor region; forming an isolating semiconductor region formed from the impurity semiconductor region of the second conductivity type by implanting ions into the semiconductor region; and forming a charge accumulation region of a first conductivity type in the semiconductor region so as to make the region be in contact with the channel stop region by implanting ions into the semiconductor region by using the second insulating portion as a mask.

The third aspect of the present invention provides a solid-state image sensor comprising: a charge accumulation region of a first conductivity type formed in a semiconductor substrate; and an element isolating portion including an insulator, wherein the insulator includes a first insulating portion arranged on the semiconductor substrate, a second insulating portion arranged adjacent to an outside of the first insulating portion, wherein thickness of the second insulating portion decreases with an increase in distance from the first insulating portion, and a third insulating portion provided on the first insulating portion, wherein the third insulating portion has an upper face and a side face, the side face connecting the upper face of the third insulating portion to an upper face of the second insulating portion.

The fourth aspect of the present invention provides a camera comprising: a solid-state image sensor defined as the first or third aspect of the present invention; and a processing unit which processes a signal output from the solid-state image sensor.

The fifth aspect of the present invention provides a method of manufacturing a solid-state image sensor, comprising the steps of: forming a polysilicon film on a semiconductor region; forming a mask having an opening on the polysilicon film; forming a first insulating portion and a second insulating portion arranged adjacent to an outside of the first insulating portion, by selectively and thermally oxidizing a portion of the polysilicon film using the mask, wherein thickness of the second insulating portion decreases with an increase in distance from the first insulating portion; and forming an insulating film serving as a third insulating portion on the first insulating portion.

Further features of the present invention will become apparent from the following description of exemplary embodiments (with reference to the attached drawings).

DESCRIPTION OF THE EMBODIMENTS

A solid-state image sensor of the present invention may be configured as a MOS image sensor, a CCD image sensor, or another type of image sensor. The solid-state image sensor can include a pixel array having a plurality of pixels two-dimensionally arrayed to form a plurality of rows and a plurality of columns, a vertical scanning circuit which selects rows in the pixel array, and a horizontal scanning circuit which selects columns in the pixel array. A region in which a pixel array is arranged is called a pixel region, and a region in which peripheral circuits such as a vertical scanning circuit and a horizontal scanning circuit are arranged (a region other than a pixel region) will be referred to as a peripheral region.

Figure 1:
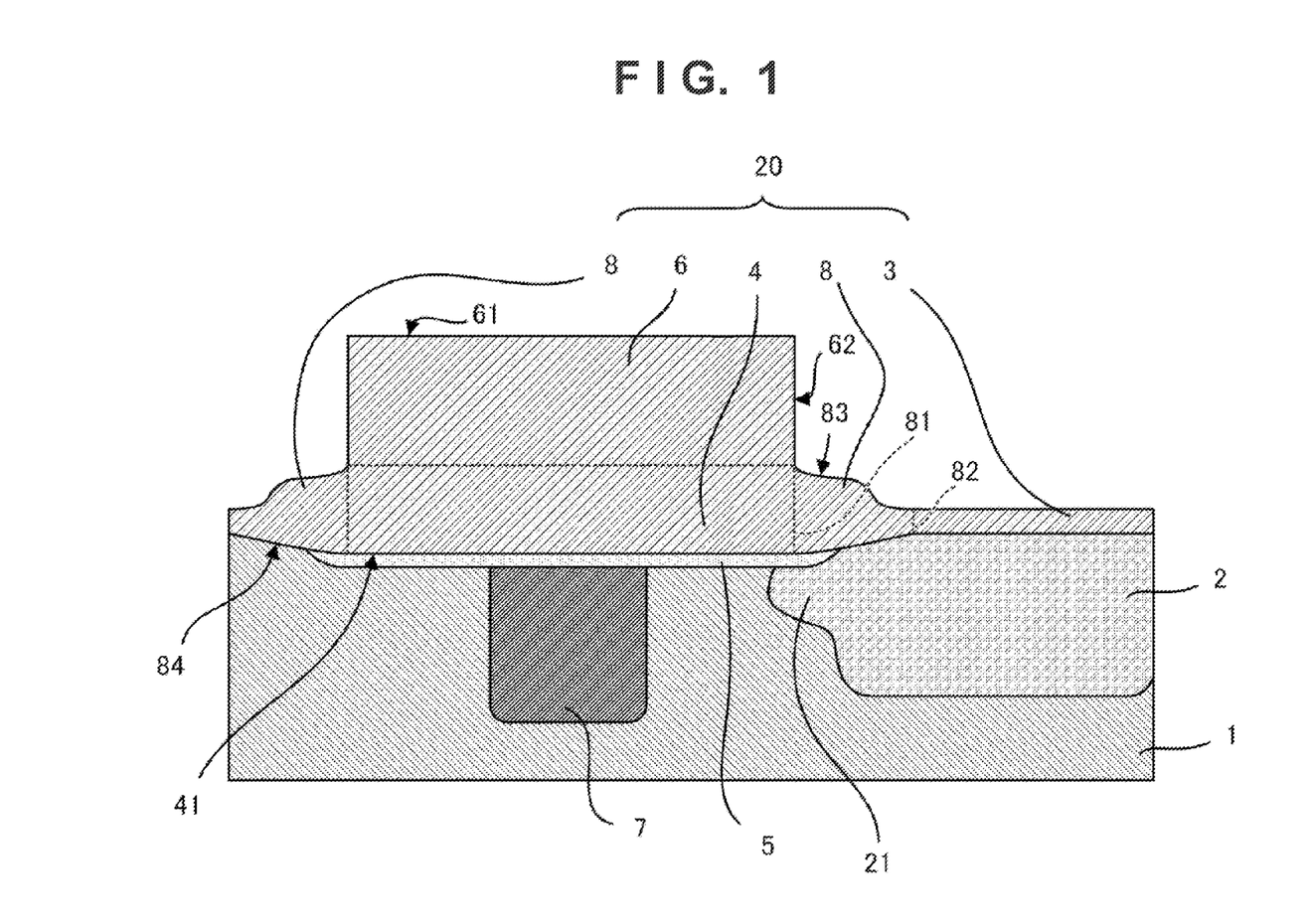
FIG. 1 is a sectional view showing the arrangement of a pixel in a solid-state image sensor according to the first embodiment of the present invention.

The arrangement of a pixel in the solid-state image sensor according to the first embodiment of the present invention will be described with reference to FIG. 1. Note that FIG. 1 exemplarily shows the partial arrangement of one pixel. Each pixel includes a charge accumulation region 2 of the first conductivity type formed on a semiconductor substrate 1 as a semiconductor region of the first conductivity type, an insulator 20, an isolating semiconductor region 7 formed from an impurity semiconductor region of the second conductivity type, and a channel stop region 5 formed from an impurity semiconductor region of the second conductivity type. In this case, the first conductivity type may be either an n type or p type. The second conductivity type is a conductivity type different from the first conductivity type. A part of the insulator 20 and the isolating semiconductor region 7 form an element isolating portion which isolates elements from each other. The charge accumulation region 2 is a region which generates and accumulates charge corresponding to the amount of incident light. The isolating semiconductor region 7 forms a potential barrier for signal charge and has a function of isolating the charge accumulation region 2 and other elements (for example, other charge accumulation regions 2) from each other.

The insulator 20 includes a first insulating portion 4 arranged on the channel stop region 5 on the isolating semiconductor region 7 and a second insulting portion 8 extending from the first insulating portion 4 laterally. The insulator 20 can typically include a third insulating portion 6 arranged on the first insulating portion 4. The third insulating portion 6 can contribute to an increase in the thickness of the insulator 20 on the isolating semiconductor region 7 and an improvement in element isolation effect. The first insulating portion 4, the third insulating portion 6, and the second insulting portion 8 are typically made of the same material and can have an integral arrangement.

The second insulting portion 8 is arranged adjacent to the outside of the first insulating portion 4, and is structured to smoothly decrease in thickness with an increase in distance from the first insulating portion 4. It is possible to form the first insulating portion 4 by, for example, oxidizing a polysilicon film. The lower face of the first insulating portion 4 can exist at a position lower than the surface of the semiconductor substrate 1 in the charge accumulation region 2. It is possible to obtain such a structure by shallowly oxidizing the surface of the semiconductor substrate 1 when forming the first insulating portion 4.

The third insulating portion 6 includes an upper face 61 higher than the maximum height of an upper face 83 of the second insulting portion 8 and a side face 62 connecting the upper face 61 to the upper face 83 of the second insulting portion 8. The side face 62 can typically be perpendicular to the surface of the semiconductor substrate 1. It is possible to form the third insulating portion 6 by, for example, depositing silicon oxide on the first insulating portion 4 by the CVD method. It is possible to form the second insulting portion 8 by oxidizing a polysilicon film. The insulator 20 can include an insulating film 3 covering the surface of the semiconductor substrate 1 outside the second insulting portion 8.

The insulator 20 including the first insulating portion 4, the second insulting portion 8, and the third insulating portion 6 can be regarded as an insulator including the flat first upper face 61, the second upper face (the upper face of the second insulting portion 8) 83 which smoothly decreases in height with an increase in distance from the first upper face 61, and the side face 62 connecting the first upper face 61 to the second upper face 83. In this case, the first upper face 61 is higher than the second upper face 83. The insulator 20 also includes a first lower face 41 of the first insulating portion 4 and a second lower face 84 of the second insulting portion 8. The first lower face 41 and the second lower face 84 form a continuous smooth surface.

The charge accumulation region 2 is formed by implanting ions into the semiconductor substrate 1 through the second insulting portion 8 (and the insulating film 3 if the insulating film 3 is present). The charge accumulation region 2 includes a peripheral portion 21 in contact with the channel stop region 5. The peripheral portion 21 is a portion formed by implanting ions into the semiconductor substrate 1 through the second insulting portion 8, and has an impurity concentration lower than the remaining portion of the charge accumulation region 2. Part of the outer boundary of the channel stop region 5 can exist outside an inner boundary 81 of the second insulting portion 8 and inside an outer boundary 82 of the second insulting portion 8. In this case, the boundary between the first insulating portion 4 and the second insulting portion 8, that is, the inner boundary 81 of the second insulting portion 8, is a position where the insulator 20 starts to decrease in thickness with an increase in distance from the first insulating portion 4. The boundary between the first insulating portion 4 and the second insulting portion 8 can be flush with a side face of the third insulating portion 6. In the presence of the insulating film 3, the boundary between the second insulting portion 8 and the insulating film 3, that is, the outer boundary 82 of the second insulting portion 8, is a position where the insulator 20 stops changing in thickness with an increase in distance from the first insulating portion 4.

According to the first embodiment, the second insulting portion 8 of the insulator 20 is structured to smoothly decrease in thickness with an increase in distance from the first insulating portion 4. Therefore, the boundary between the insulator 20 and the semiconductor substrate 1 (in this case, the semiconductor substrate 1 includes the charge accumulation region 2, the channel stop region 5, and the isolating semiconductor region 7) is formed into a smooth curved surface. Since the impurity concentration of the peripheral portion 21 of the charge accumulation region 2 is lower than the remaining portion of the charge accumulation region 2, electric field concentration at the portion where the channel stop region 5 is in contact with the charge accumulation region 2 is suppressed. This can reduce a leak current mixing in the charge accumulation region 2. In addition, according to the first embodiment, the charge accumulation region 2 is formed under the region of the second insulting portion 8 and extends below the region of the first insulating portion 4. This increases the volume of the charge accumulation region 2 and increase the saturated electric field amount. In addition, since the first embodiment forms the insulator 20 without forming a trench in the semiconductor substrate 1, it is possible to reduce etching damage on the semiconductor substrate 1.

A method of manufacturing the solid-state image sensor according to the first embodiment of the present invention will be exemplarily described below with reference to FIGS. 2A to 2G. Note that FIGS. 2A to 2G omit the illustration of other elements (for example, transistors) constituting a pixel and elements constituting peripheral circuits (for example, a vertical scanning circuit and horizontal scanning circuit). To provide a more specific example, assume that the first conductivity type is an n type, and the second conductivity is a p type.

Figure 2A:
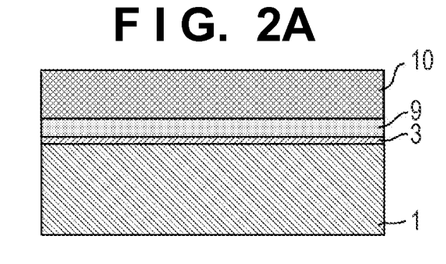
FIGS. 2A to 2G are sectional views showing a method of manufacturing the solid-state image sensor according to the first embodiment of the present invention.

First of all, in the step shown in FIG. 2A, the first conductivity type semiconductor substrate (for example, n-type silicon substrate) 1 is prepared, and its surface is oxidized to form the oxide film (for example, a silicon oxide film) 3. A polysilicon film 9 is then formed on the insulating film 3. Note that the step of forming the insulating film 3 is a step which can be arbitrarily executed. It is possible to form the polysilicon film 9 by, for example, the CVD method (Chemical Vapor Deposition) so as to make it have a thickness within the range of 20 nm to 70 nm. A silicon nitride film 10 is formed on the polysilicon film 9. It is possible to form the silicon nitride film 10 by, for example, the CVD method so as to make it have a thickness within the range of 100 nm to 200 nm. The silicon nitride film 10 can function not only as a mask when forming a thermally-oxidized film (to be described later) (see FIG. 2C) but also as a stopper film in a polishing step (see FIG. 2E) of polishing an oxide film to form the third insulating portion 6 by the CMP method (Chemical Mechanical Polishing method).

Figure 2B:
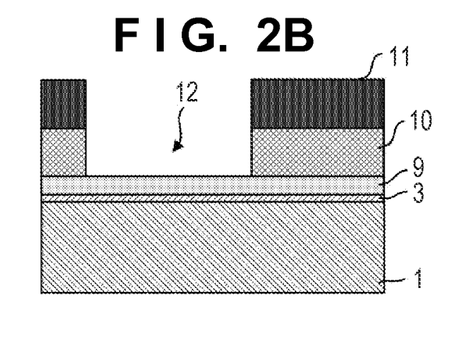

In the step shown in FIG. 2B, a resist pattern 11 is formed, which has an opening corresponding to a region where the first insulating portion 4 should be formed. Etching the silicon nitride film 10 by using the resist pattern 11 will form an opening 12. At this time, the etching selectivity between the silicon nitride film 10 and the polysilicon film 9 is increased to expose the surface of the polysilicon film 9.

Figure 2C:
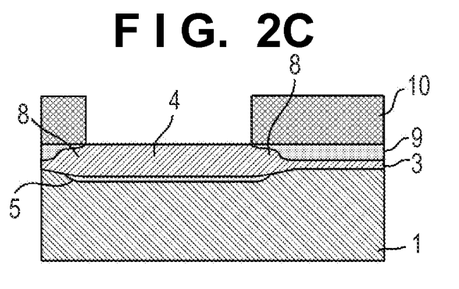

In the step shown in FIG. 2C, part of the polysilicon film 9 and part of the surface of the semiconductor substrate 1 are selectively and thermally oxidized by using the resist pattern 11 and the silicon nitride film 10 as masks. At this time, the first insulating portion 4 is formed in regions, of the polysilicon film 9 and the surface of the semiconductor substrate 1, whose outer boundaries are defined by the opening 12, and the second insulting portion 8 is formed outside of the first insulating portion 4. The second insulting portion 8 is structured to smoothly decrease in thickness with an increase in distance from first insulating portion 4. The presence of the polysilicon film 9 allows the second insulting portion 8 to form, having a smooth upper face. Forming this portion makes it possible to reduce residues of a conductive film such as a polysilicon film after patterning or the like. As is obvious from the above description, it is possible to perform oxidation to make the lower face of the first insulating portion 4 reach the semiconductor substrate 1. In the step shown in FIG. 2C, after the formation of the first insulating portion 4, the channel stop region 5 is formed by implanting ions for the formation of an impurity semiconductor region of the second conductivity type into the semiconductor substrate 1 by using the resist pattern 11 and the silicon nitride film 10 as masks. For example, the channel stop region 5 is formed by implanting a p-type impurity (for example, boron) into the semiconductor substrate 1 within the range of $1 \times 10^{12}$ to $7 \times 10^{13}$ ions/cm$^2$.

Figure 2D:
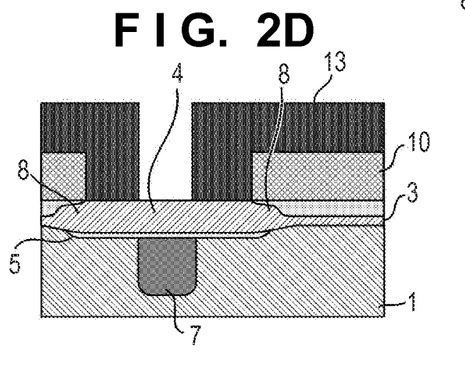

In the step shown in FIG. 2D, a resist pattern 13 is formed, which has an opening corresponding to a region where the isolating semiconductor region 7 should be formed. The isolating semiconductor region 7 is formed by implanting ions for the formation of an impurity semiconductor region of the second conductivity type into the semiconductor substrate 1 by using the resist pattern 13 as a mask. For example, the isolating semiconductor region 7 is formed by implanting a p-type impurity (for example, boron) into the semiconductor substrate 1 within the range of $1 \times 10^{12}$ to $1 \times 10^{15}$ ions/cm$^2$. The width of the isolating semiconductor region 7 may be smaller than or equal to that of the opening 12. As the width of the isolating semiconductor region 7 decreases, it is possible to form the charge accumulation region 2 having a larger area, and hence to increase the saturated charge amount. Note that the channel stop region 5 may be formed after the formation of the isolating semiconductor region 7. In addition, it is possible to perform these formation steps before the formation of an insulating portion by thermal oxidation. However, forming the channel stop region 5, in particular, after thermal oxidation makes it possible to suppress the diffusion of an impurity and control the saturated charge amount. The resist pattern 13 is removed after the formation of the isolating semiconductor region 7.

Figure 2E:
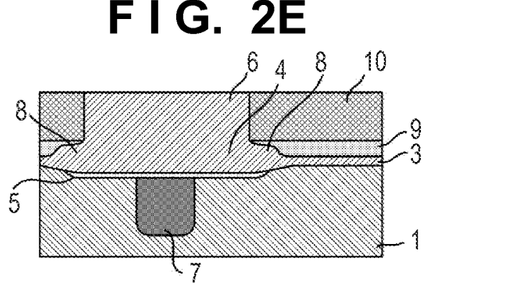

In the step shown in FIG. 2E, the opening 12 of the silicon nitride film 10 is filled with the third insulating portion 6 so as to make it overlap the first insulating portion 4. The third insulating portion 6 can be formed from, for example, silicon oxide. It is possible to form the third insulating portion 6 by, for example, the CVD method such as the plasma CVD method. It is possible to form the third insulating portion 6 by forming an insulating film so as to cover the silicon nitride film 10 while filling the opening 12 and then planarizing the insulating film by the CMP method. At this time, using a polishing agent exhibiting a higher polishing rate for the insulating film than for the silicon nitride film 10 will remove the insulating film on the silicon nitride film 10 and form the third insulating portion 6 so as to make it overlap the first insulating portion 4, with the silicon nitride film 10 serving as a stopper, as shown in FIG. 2E. Forming the third insulating portion 6 can reduce the amount of thermal oxidation when forming the first insulating portion 4 without any deterioration in element isolation performance. It is therefore possible to decrease the width of the second insulting portion 8 (the distance between the inner boundary 81 and the outer boundary 82) while maintaining the element isolation performance as compared with the case in which the third insulating portion 6 is not formed. Decreasing the width of the second insulting portion 8 can increase the area and volume of the charge accumulation portion.

Figure 2F:
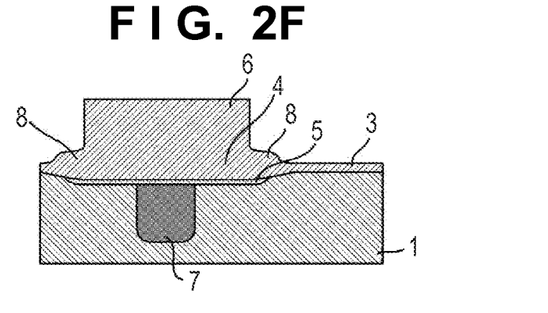
Figure 2G:
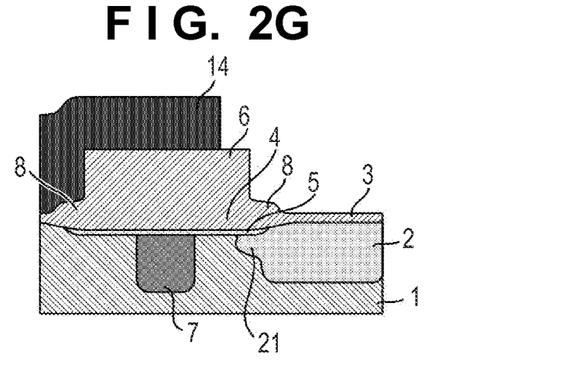

In the step shown in FIG. 2F, for example, hot phosphoric acid is used to selectively remove the silicon nitride film 10, and then, for example, an ammonia-hydrogen peroxide mixture is used to selectively remove the polysilicon film 9. Subsequently, in the step shown in FIG. 2G, a resist pattern 14 is formed, which has an opening corresponding to a region in which the charge accumulation region 2 should be formed. The charge accumulation region 2 is formed by implanting ions for the formation of an impurity semiconductor region of the first conductivity type into the semiconductor substrate 1 by using the resist pattern 14 and the third insulating portion 6 as masks. For example, it is possible to form the charge accumulation region 2 by implanting arsenic as an n-type impurity into the semiconductor substrate 1. It is possible to implant arsenic into the semiconductor substrate 1 at a tilted angle so as to make the arsenic reach below the region of the second insulting portion 8. The charge accumulation region 2 is formed by implanting ions into the semiconductor substrate 1 through the second insulting portion 8, and hence the peripheral portion 21 of the charge accumulation region 2 (a portion in contact with the channel stop region 5) has a lower impurity concentration than the remaining portion.

Figure 3:
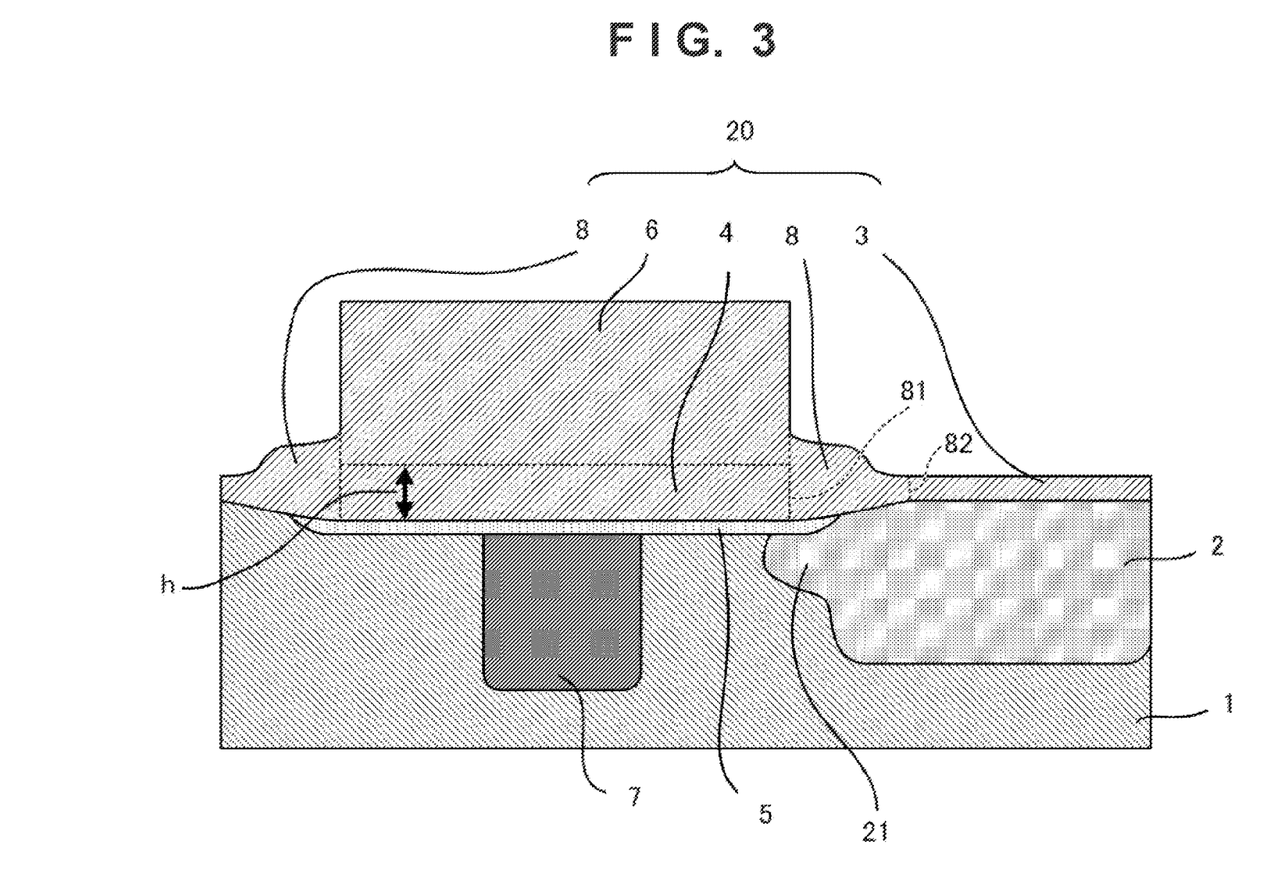
FIG. 3 is a sectional view showing the arrangement of a pixel in a solid-state image sensor according to the second embodiment of the present invention.

The arrangement of a pixel in a solid-state image sensor according to the second embodiment of the present invention will be described below with reference to FIG. 3. Note that FIG. 3 exemplarily shows the partial arrangement of one pixel. Any matter that is not specifically referred to below can comply with the first embodiment. The solid-state image sensor of the second embodiment differs from that of the first embodiment in that the upper face of a first insulating portion 4 having a thickness h is arranged at a position lower than the maximum height of an upper face 83 of a second insulting portion 8 (a position nearer to the surface of the semiconductor substrate 1). In the solid-state image sensor of the second embodiment, a third insulating portion 6 has a portion filling a concave portion formed by the step between the upper face of the first insulating portion 4 and the upper face of the second insulting portion 8. A material for the third insulating portion 6 may be different from or the same as that for the first insulating portion 4 and the second insulting portion 8.

A method of manufacturing the solid-state image sensor according to the second embodiment of the present invention will be exemplarily described below with reference to FIGS. 4A to 4G. Note that FIGS. 4A to 4G omit the illustration of other elements (for example, transistors) constituting a pixel and elements constituting peripheral circuits (for example, a vertical scanning circuit and horizontal scanning circuit).

Figure 4A:
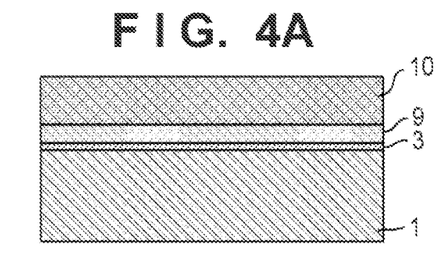
FIGS. 4A to 4G are sectional views showing a method of manufacturing the solid-state image sensor according to the second embodiment of the present invention.

The step shown in FIG. 4A can be the same as that shown in FIG. 2A. In the step shown in FIG. 4B, a resist pattern 11 is formed, which has an opening corresponding to a region where the first insulating portion 4 of the pixel region should be formed, and an opening 12 is formed by etching a silicon nitride film 10 by using the resist pattern 11 as a mask. In addition, a portion of a polysilicon film 9 which corresponds to a region exposed in the opening 12 is etched to decrease the thickness of the polysilicon film 9 in the region, thereby forming a concave portion in the polysilicon film 9. Changing the thickness of the polysilicon film 9 can control the thickness of the first insulating portion 4 formed in the step shown in FIG. 4C to an arbitrary thickness h.

Figure 4B:
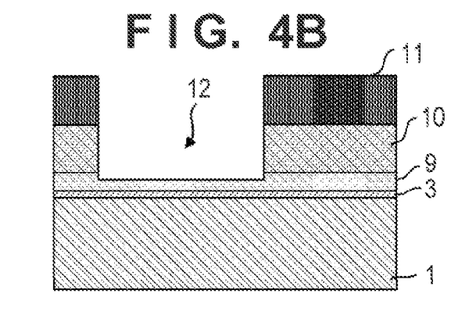
Figure 4C:
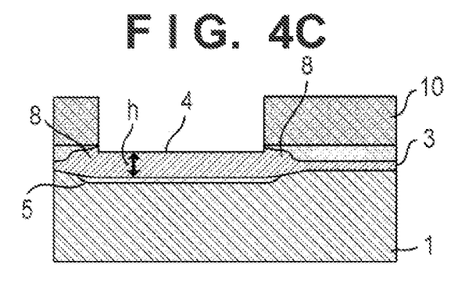
Figure 4D:
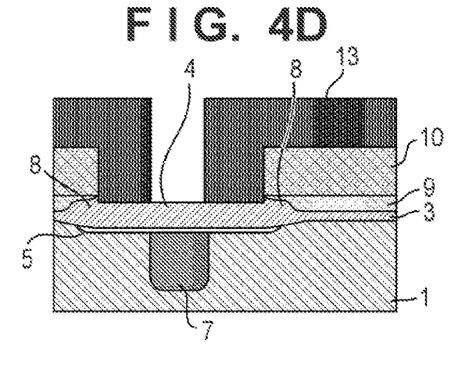
Figure 4E:
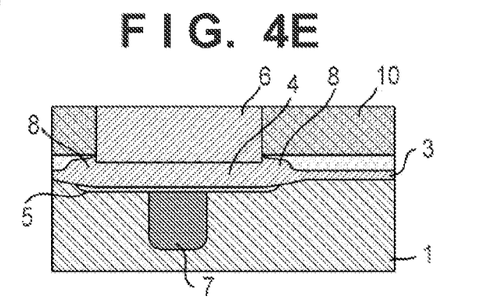
Figure 4F:
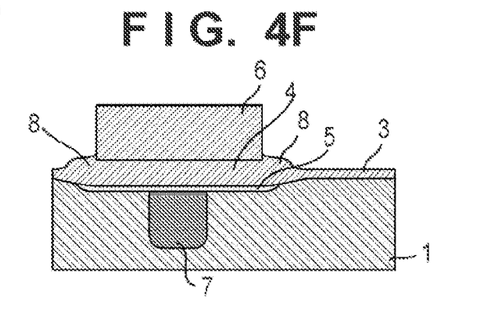
Figure 4G:
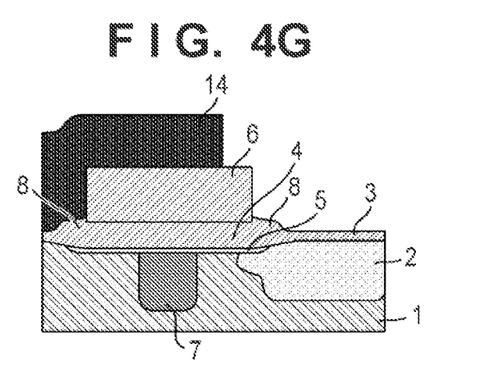

In the step shown in FIG. 4C, regions, of the polysilicon film 9 and the upper face of the semiconductor substrate 1, which correspond to the opening 12 are thermally oxidized by using the resist pattern 11 and the silicon nitride film 10 as masks. At this time, the first insulating portion 4 having the thickness h is formed in the regions, of the polysilicon film 9 and the surface of the semiconductor substrate 1, whose outer boundaries are defined by the opening 12. In addition, the second insulting portion 8 is formed outside the first insulating portion 4. The steps shown in FIGS. 4D to 4G are the same as those shown in FIGS. 2D to 2G.

The second embodiment forms a concave portion by etching the silicon nitride film 10 in the step shown in FIG. 4B, and hence shortens the time required for thermal oxidation for the formation of the second insulting portion 8. This can contribute to, for example, the suppression of the diffusion of unnecessary impurities into the semiconductor substrate 1.

As an application of the solid-state image sensor according to each embodiment described above, a camera incorporating the solid-state image sensor will be exemplarily described below. The concept of camera includes not only apparatuses mainly designed to perform imaging but also apparatuses including imaging functions as auxiliary functions (for example, personal computers and portable terminals). The camera includes the solid-state image sensor according to the present invention, which has been exemplified as each embodiment described above, and a processing unit which processes signals output from the solid-state image sensor. The processing unit can include, for example, an A/D converter and a processor which processes digital data output from the A/D converter.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application Nos. 2010-279860, filed Dec. 15, 2010 and 2011-253139, filed Nov. 18, 2011, which are hereby incorporated by reference herein in their entirety.

What is claimed is:

1. A solid-state image sensor comprising:
   a charge accumulation region of a first conductivity type formed in a semiconductor region;
   an isolating semiconductor region formed in the semiconductor region and formed from an impurity semiconductor region of a second conductivity type;
   a channel stop region formed from an impurity semiconductor region of the second conductivity type which is located in the semiconductor region and formed on the isolating semiconductor region; and an insulator arranged on the channel stop region, wherein the insulator includes a first insulating portion arranged on the channel stop region, a second insulating portion extending laterally from the first insulating portion, wherein a thickness of the second insulating portion decreases with an increase in distance from the first insulating portion, and wherein a portion of the insulator, whose thickness gradually changes, consists of the second insulating portion, and a third insulating portion being formed on the first insulating portion so as to protrude from a structure consisting of the first insulating portion and the second insulating portion, the third insulating portion including (i) a flat upper face and (ii) a side face extending from the flat upper face of the third insulating portion to an upper face of the second insulating portion, the side face being formed as a part of an exposed surface of the insulator.

2. The sensor according to claim 1, wherein the charge accumulation region includes a peripheral portion which is in contact with the channel stop region.

3. The sensor according to claim 1, wherein a portion of an outer boundary of the channel stop region is located outside an inner boundary of the second insulating portion and inside an outer boundary of the second insulating portion.

4. The sensor according to claim 1, wherein an upper face of the first insulating portion is arranged at a position lower than a maximum height of the upper face of the second insulating portion so as to make the upper face of the first insulating portion and the upper face of the second insulating portion form a concave portion, and the third insulating portion includes a portion filling the concave portion.

5. The sensor according to claim 1, wherein the first insulating portion and the second insulating portion are formed from silicon oxide.

6. The sensor according to claim 1, wherein the first insulating portion, the second insulating portion, and the third insulating portion are formed from silicon oxide.

7. The sensor according to claim 1, wherein the side face is perpendicular to the flat upper surface.

8. A solid-state image sensor comprising:

a charge accumulation region of a first conductivity type formed in a semiconductor substrate; and an element isolating portion including an insulator, wherein the insulator includes a first insulating portion arranged on the semiconductor substrate, a second insulating portion extending laterally from the first insulating portion, wherein a thickness of the second insulating portion decreases with an increase in distance from the first insulating portion, and wherein a portion of the insulator, whose thickness gradually changes, consists of the second insulating portion, and a third insulating portion being provided on the first insulating portion, the third insulating portion including (i) a flat upper face and (ii) a side face extending from the flat upper face of the third insulating portion to an upper face of the second insulating portion, the side face being formed as a part of an exposed surface of the insulator.

9. The sensor according to claim 8, wherein a boundary between the first insulating portion and the second insulating portion is flush with the side face of the third insulating portion.

10. The sensor according to claim 8, wherein an upper face of the first insulating portion is arranged at a position lower than a maximum height of the upper face of the second insulating portion so as to make the upper face of the first insulating portion and the upper face of the second insulating portion form a concave portion, and the insulator further includes a third insulating portion including a portion filling the concave portion.

11. The sensor according to claim 8, wherein an isolating semiconductor region formed from an impurity semiconductor region of a second conductivity type formed in the semiconductor substrate, and a channel stop region formed from an impurity semiconductor region of the second conductivity type located in the semiconductor substrate and formed on the isolating semiconductor region are provided below the insulator.

12. A camera comprising:

a solid-state image sensor defined in claim 1; and a processing unit which processes a signal output from the solid-state image sensor.

* * * * *